United States Patent [19]
Parker

[11] Patent Number: 5,825,174
[45] Date of Patent: Oct. 20, 1998

[54] TEMPERATURE RESPONSIVE BATTERY TESTER

[75] Inventor: Robert Parker, 411 Rolling Hills La., Alamo, Calif. 94507

[73] Assignees: Robert Parker, Palm Desert, Calif.; Jack Brass, Toronto, Canada

[21] Appl. No.: 769,648

[22] Filed: Dec. 19, 1996

Related U.S. Application Data

[60] Division of Ser. No. 307,341, Sep. 16, 1994, Pat. No. 5,610,511, which is a continuation-in-part of Ser. No. 139,363, Oct. 19, 1993, Pat. No. 5,460,902, which is a continuation-in-part of Ser. No. 58,449, May 7, 1993, Pat. No. 5,389,470.

[51] Int. Cl.$^6$ .................. G01R 19/00; G01N 27/416
[52] U.S. Cl. .................. 324/106; 324/96; 324/435
[58] Field of Search .................. 324/106, 104, 324/96, 429, 433, 435, 438; 359/44; 429/90, 92, 93

[56] References Cited

U.S. PATENT DOCUMENTS

| | | | |
|---|---|---|---|
| 3,309,610 | 3/1967 | Yamamoto . | |
| 3,602,867 | 8/1971 | Kohler | 338/120 |
| 3,619,692 | 11/1971 | Day | 338/120 |
| 3,667,039 | 5/1972 | Garfein et al. . | |
| 3,725,898 | 4/1973 | Canton | 345/106 |
| 3,774,195 | 11/1973 | Schulthess et al. . | |
| 3,877,008 | 4/1975 | Payne | 345/106 |
| 3,878,466 | 4/1975 | Henrickson et al. | 338/120 |
| 3,897,643 | 8/1975 | Morris, Jr. et al. | 345/106 |
| 4,006,414 | 2/1977 | Parker . | |
| 4,571,533 | 2/1986 | Dey . | |
| 4,673,256 | 6/1987 | Hehlen et al. | 359/44 |
| 4,702,564 | 10/1987 | Parker . | |
| 4,726,661 | 2/1988 | Parker . | |
| 4,737,020 | 4/1988 | Parker . | |
| 4,835,476 | 5/1989 | Kurosawa . | |
| 5,059,895 | 10/1991 | Cataldi et al. . | |
| 5,122,751 | 6/1992 | Aita et al. | 324/429 |
| 5,128,616 | 7/1992 | Palmer . | |
| 5,164,699 | 11/1992 | Smith et al. | 338/120 |
| 5,216,371 | 6/1993 | Nagai . | |
| 5,293,156 | 3/1994 | Shoji et al. | 340/648 |
| 5,417,575 | 5/1995 | McTaggart | 434/317 |

FOREIGN PATENT DOCUMENTS

1100479    4/1989    Japan .

*Primary Examiner*—Ernest F. Karlsen
*Attorney, Agent, or Firm*—Renner, Otto, Boisselle & Sklar

[57] ABSTRACT

A device for measuring the voltage of a voltage source includes a number of temperature responsive displays and a circuit including a number of heating circuits, each heating circuit for heating one of the temperature responsive displays when a threshold voltage of the heating circuit is exceeded, and a printed resistor, each heating circuit being connected to a length of the printed resistor such that the voltage of the voltage source at which each heating circuit heats a temperature responsive display is a function of the ratio of the lengths of the printed resistor to which the heating circuits are connected.

9 Claims, 5 Drawing Sheets

TEMPERATURE RESPONSIVE BATTERY TESTER

RELATED APPLICATION

This is a division of specification Ser. No. 08/307,341, filed Sep. 16, 1994, now U.S. Pat. No. 5,610,511 which is a continuation-in-part of U.S. patent application Ser. No. 08/139,363, filed Oct. 19, 1993, now U.S. Pat. No. 5,460,902 which is a continuation-in-part U.S. patent application Ser. No. 08/058,449 filed May 7, 1993, now U.S. Pat. No. 5,389,470.

FIELD OF THE INVENTION

The invention relates generally to a voltage or current sensor, and, more particularly, to a device for accurately measuring the voltage of a battery.

BACKGROUND OF THE INVENTION

Devices employing thermochromic materials for testing the relative charge on a battery are well known. An example of one such device is that commonly found in a package of Duracell® batteries. This type of device uses a tapered resistance conductor printed on one side of a thin polyester film with a thermochromic material printed in the other side of the film. When a voltage is applied across the tapered resistance conductor, a portion of the conductor roughly proportional to the state of charge of the battery is heated sufficiently to cause a corresponding portion of the thermochromic material to change from opaque to transparent, thus providing an indication of the relative voltage or state of charge of the battery. These devices work well for batteries, such as alkaline batteries, in which the relative voltage varies significantly from a fully charged condition to a depleted condition, for example, 50 percent or from 1.55 volts to 1.0 volts.

However, these tapered resistance devices do not work as well for some other types of batteries where the voltage delivered by a depleted battery is not a significant percent lower than the voltage delivered by a fully charged battery. For example, a lead-acid battery which is typically used in a car, truck or boat exhibits a very small change in voltage with respect to a large decrease in the charge of the battery. For instance, a lead-acid car battery may be at 12.8 volts when fully charged and decrease only to 12 volts when the battery is completely discharged. Rechargeable nickel-cadmium batteries, such as are used in portable computers, video cameras and power tools, also exhibit a relatively small change in voltage with respect to a large change in battery charge. In the case of nickel-cadmium batteries it is also desirable to be able to measure the voltage of the battery accurately in order to ascertain when the battery needs to be recharged. Nickel-cadmium batteries have a memory effect and thus should be almost completely discharged before recharging to promote a complete charge and longer battery life. However, these batteries should not be discharged completely or voltage reversal of the battery can result.

It would be desirable to provide a battery tester which is capable of accurately measuring small changes in the voltage delivered by a battery.

SUMMARY OF THE INVENTION

The battery tester of the present invention permits the accurate testing of voltages over a small range of battery voltages by conducting heat through a heat generating element when certain circuit conditions have been met. The tester may include a device such as a diode which generates heat once a threshold conducting voltage has been exceeded or a comparator which permits current flow through a heat generating device, such as a resistor, when the voltage at the comparator as supplied by the battery exceeds a reference voltage. Advantageously, the displays, the passive resistive elements, conductive paths, switches and contacts may be printed on a substrate with the active elements, such as diodes and comparators, surface mounted.

In accordance with one embodiment of the present invention a device for measuring the voltage of a voltage source includes a number of temperature responsive displays and a circuit including a number of heating circuits, each heating circuit for heating one of the temperature responsive displays when a threshold voltage of the heating circuit is exceeded, and a printed resistor, each heating circuit being connected to a length of the printed resistor such that the voltage of the voltage source at which each heating circuit heats a temperature responsive display is a function of the ratio of the lengths of the printed resistor to which the heating circuits are connected.

In accordance with another embodiment of the invention a device for measuring the voltage of a voltage source includes a number of temperature responsive displays, a number of heat generating elements, each of which is thermally coupled to at least one of the temperature responsive displays, a voltage divider network, and a number of comparator circuits, each for selectively allowing current to flow through at least one of the heat generating elements when the voltage supplied to the comparator circuit by the voltage divider network exceeds a reference voltage.

In accordance with a further embodiment of the invention, a device for measuring the voltage of a voltage source includes a number of temperature responsive displays and a circuit including plural heating circuits, each heating circuit for heating one of the temperature responsive displays when a threshold voltage of the heating circuit is exceeded, and at least one printed resistor, each heating circuit being connected to a printed resistor such that the voltage of the voltage source at which each heating circuit heats a temperature responsive display is a function of the ratio of the resistances of the printed resistors to which the heating circuits are connected.

In accordance with a still further embodiment of the invention, a display circuit includes a substrate, a number of passive electrical elements including a temperature responsive display, conductive paths, resistive elements and contacts printed on the substrate, and at least one active electrical element surface mounted to at least one of the passive electrical elements.

These and other features of the invention are hereinafter fully described and particularly pointed out in the claims, the following description and the annexed drawings setting forth in detail certain illustrative embodiments of the invention, these being indicative, however, of but a few of the various ways in which the principles of the invention may be employed.

DETAILED DESCRIPTION OF THE PREFERRED EMBODIMENTS OF THE INVENTION

Figure 1:
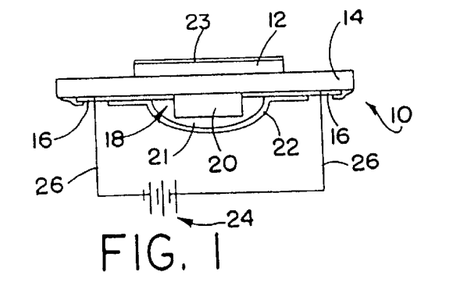
FIG. 1 is an elevation view of a battery tester in accordance with one embodiment of the present invention schematically connected to a battery source.

With reference to the several figures, and initially to FIG. 1, there is illustrated an elevation view of thermochromic battery tester 10 in accordance with one embodiment of the present invention. The battery tester 10 includes a temperature responsive display 12 disposed on one side of a thin film 14, such as a polyester film, with conductive strips or leads 16 disposed on the side of the film opposite the temperature responsive display. The temperature responsive display 12 and conductive strips 16 may be disposed on or applied to the film 14 through any of a variety of conventional methods including, for example, printing. The conductive strips 16 may also be constructed of multiple elements, for example, a section of wire or other conductive element attached to a printed conductive strip. The conductive strips 16 extend substantially the length of the film 14 with an interruption in an area 18 opposite the temperature responsive display 12. A zener diode 20 or other electrical component, such as another form of diode or a transistor, etc., which substantially conducts current only when the voltage across the device exceeds a threshold level is electrically connected to each of the conductive strips 16. The zener diode 20 is preferably packaged in a surface mount configuration and may be fixed to the film and held stationary such as through use of a potting material 21. A thin laminate 22, for example 0.0005 to 0.001 inch thick, may be applied over the bottom side of the film 14, the potting material 21 and the conductive strip 16 to reduce the possibility of any of the components becoming damaged. The laminate 27 would not cover the portions of the conductive strips 16 used for contact with battery or other voltage source. The temperature responsive display 12 disposed on the polyester film 14 preferably includes one or more thermochromic materials which exhibit a discernible visible change at a predetermined transition temperature. Preferably the thermochromic materials are of a certain opaque color, different from the color of the film 14 and different from each other, below their respective transition temperatures and transparent above their transition temperatures. When employing multiple thermochromic materials it is also desirable that the thermochromic materials have different transition temperatures. Some temperature responsive materials are sensitive to UV light and, when subjected to UV light, may tend to degrade over time. When such materials are used in the temperature responsive display 12 it may be desirable to apply a UV light protective coating 23 to the top of the display 12 to shield the temperature responsive materials employed therein from the harmful effects of ambient UV light. It may also be possible to incorporate additives directly with the thermochromic materials to protect them from UV light. An example of such an additive would be an anti-oxidant. Such anti-oxidant could be included as an additive to the thermochromic material and/or to the encapsulating material containing such thermochromic material. An exemplary thermochromic material useful in the invention is that sold under the designation R45 Matsui Ink by Matsui Chemical Company, Kyoto, Japan; the designation "45" indicating switching ability at about +45° C. Other switching temperatures may be used for the various thermochromic materials described herein. Other thermochromic materials also may be used which provide a discernible output as a function of temperature. Another exemplary material useful in the invention is that known as liquid crystal material. Other materials also may be used to provide the desired display characteristics in response to or as a function of temperature.

The conductive strips 16 disposed on the film 14 provide electrical contact areas for pressure contact with the terminals of a battery to be tested, thus forming an electrical circuit including the battery electrically connected to the zener diode 20 by the conductive strips. The battery is illustrated schematically in FIG. 1 as a voltage source 24 and leads 26. Preferably, the battery tester 10 is configured to readily make contact with the terminals of a battery at designated areas on the conductive strips 16.

Figure 2:
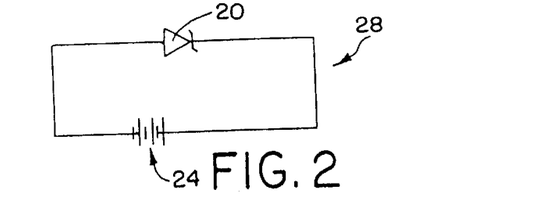
FIG. 2 is a schematic illustration of the circuit of the battery tester of FIG. 1.

The circuit of battery tester 10 of FIG. 1 is illustrated schematically in FIG. 2 as a zener diode 20 and voltage source 24. The zener diode 20 in the circuit 28 acts as a switch to bias the voltage produced by the voltage source 24 so that little or no current will flow through the circuit until a specific threshold conducting voltage of the zener diode is exceeded. At voltages supplied by the voltage source 24 exceeding the threshold conducting voltage of the zener diode 20, the diode will conduct electricity at a current which is a function of the internal resistance of the diode and the amplitude of the voltage produced by the voltage source exceeding the threshold voltage. In this manner the zener diode 20 biases the circuit 28 so that relatively small voltage changes produced by the voltage source 24 can be accurately measured. When the voltage source 24 is a car battery, for example, the circuit may be designed to measure only a one volt range of voltages between 13 and 12 volts, thus permitting the charge of the car battery to be accurately measured.

When configured to operate as a tester for a car battery, as an example, a zener diode 20 typically will be employed with a threshold conducting voltage of approximately 12 volts. When the battery tester 10 is attached to the car battery, such as is schematically illustrated in FIG. 1 at 24, the zener diode 20 will bias the circuit so that at voltages below the threshold voltage of 12 volts there will be substantially no current through the circuit formed by the zener diode, the conductive strips 16, the battery 24 and leads 26. At voltages supplied to the zener diode 20 exceeding the threshold voltage of 12 volts, a current will flow through the circuit causing the zener diode to generate heat as a function of the voltage supplied from the battery exceeding the threshold conducting voltage and the internal resistance of the diode. The heat generated by the zener diode 20 is dissipated through the film 14 to heat the temperature responsive display 12 from the center of the display located directly above the zener diode and radially outwardly from the center of the display. Consequently, once the temperature responsive display 12 has been heated to its steady state condition, the center of the display will be the hottest with the temperatures at points radially more distant from the center being at progressively lower temperatures.

The thermochromic materials employed in the temperature responsive display 12 and the zener diode 20 are chosen so that at full charge for the battery 24, a relatively large area of the temperature responsive display will be heated to temperatures above the transition temperatures of the thermochromic materials. When the battery 24 is partially depleted, the battery will provide a voltage which exceeds the threshold voltage of the zener diode 20 to a lesser extent than when the battery is in a fully charged condition. Since the zener diode 20 generates heat as a function of the voltage supplied by the battery 24 exceeding the threshold voltage of the diode and the internal resistance of the diode, the diode will generate less heat when the battery is in a partially depleted condition than when it is in its fully charged condition. Therefore, when the battery is in a partially depleted condition a lesser area of the temperature responsive display 12 will be elevated above the transition temperature of the thermochromic materials employed therein.

When the battery is sufficiently depleted that it can supply a voltage only below the threshold voltage of the zener diode 20, the diode acts as a switch preventing any substantial amount of current flow through the circuit. Consequently, relatively little, if any, heat is generated by the zener diode 20 and the temperature of preferably no areas of the temperature responsive display 12 is elevated to such an extent as to cause a visual response in the temperature responsive display.

By choosing a zener diode 20 with a correct threshold conducting voltage and thermochromic materials with appropriate transition temperatures, the battery tester 10 can be made to visually indicate different conditions of the battery, such as fully charged, partially charged, in need of recharge and significantly depleted. The design of the temperature response display 12, as well as the transition temperatures of the thermochromic materials employed therein, can also enhance the information available regarding the battery charge.

Figure 3:
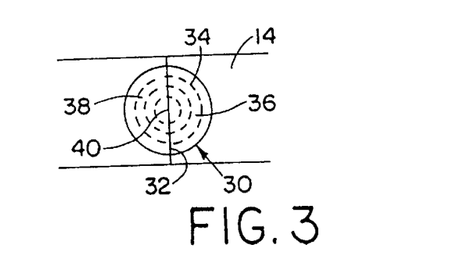
FIG. 3 is a top view of a battery tester illustrating the temperature responsive display of the battery tester.

FIG. 3 is an illustration of a temperature responsive display 30 disposed on the film 14 in a circular area. The film is preferably of two distinct colors. One color, for example, orange, being to the right of a dividing line 32 and another color, for example, green, to the left of the dividing line 32 which is easily distinguishable from the color to the right of the dividing line. The film 14 is preferably provided with a series of concentric circular gradations 34 corresponding to certain voltage readings for the battery to be tested. The temperature responsive display 30 includes two half-circular areas of different thermochromic materials 36, 38 having differing transition temperatures. The half-circular area 36 of the thermochromic material disposed to the right of the dividing line 32 may have, for example, a transition temperature of 45° C. below which the material is opaque, say, black, and above which the material is transparent, while the half circle of thermochromic material 38 disposed to the left of the dividing line 32 may be opaque, for example also black, below its transition temperature of 60° C. and transparent above that transition temperature.

Consider as an example the battery tester 10 described above relative to FIG. 1 provided with the temperature responsive display 30 of FIG. 3 and having a zener diode 20 with a threshold conducting voltage of 12 volts. If the battery tester 10 is applied across the terminals of a car battery 24, at voltages supplied by the car battery below 12 volts, no visual change to the temperature responsive display will be apparent, i.e., the display will appear black. As successively increasing battery voltages above the threshold voltage of the zener diode 20, areas of the thermochromic material 36 will be heated above their transition temperatures of 45° C. starting at the center 40 of the display 30 and moving radially outwardly for increasing battery voltages. These areas will change from black to orange as the thermochromic material 36 transitions from black to transparent to reveal the orange portions of the film 14 and any gradations 34 in this portion of the film. At higher supplied voltages from the battery 24, the thermochromic material 38 to the left of the dividing line 32 from the center of the display 40 and extending radially outwardly will begin to exceed its transition temperature of 60° C. and change to a transparent state. As areas of the thermochromic material 38 change from black opaque state to a transparent state, the green colored portion of the film 14 and the printed gradations 34 below the thermochromic material will be revealed. Consequently, for a battery having a full charge, substantially the complete portions of both half-circles of thermochromic material 36, 38 will be heated above their transition temperatures to reveal the colored film and substantially all of the gradation lines 34 beneath the thermochromic materials. For a progressively more depleted battery fewer gradation lines 34 of the temperature responsive display will be visible as less of each half circle of thermochromic material 36, 38 is heated above its respective transition temperature. If the battery is able to produce a voltage only slightly above the threshold voltage of 12 volts for the zener diode 20, only a small region of the half circular area of thermochromic material 36 will be in a transparent state allowing only a small portion of the film 14 and possibly a gradation line or two 34 to be visible.

Figure 4:
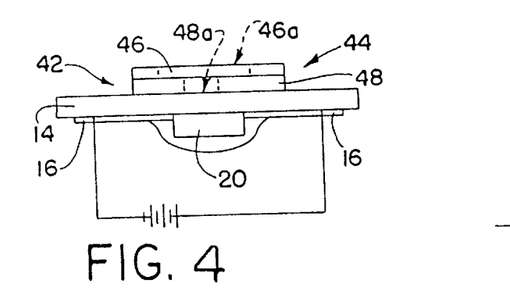
FIG. 4 is an elevation view of a battery tester similar to that of FIG. 1 employing a different temperature responsive display.
Figure 5:
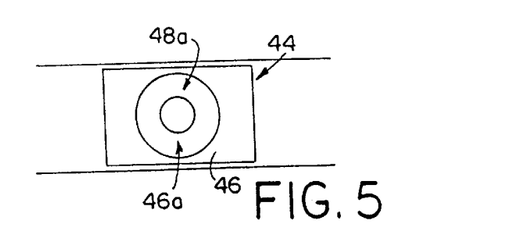
FIG. 5 is a top view of the temperature responsive display of the battery tester of FIG. 4.

A battery tester 42 with an alternate embodiment of a temperature responsive display 44 is illustrated in FIGS. 4 and 5. In this embodiment, the battery tester 42, exclusive of the temperature responsive display, is configured in the same manner as described above relative to FIG. 1 with a polyester film 14, conductive strips 16 and a zener diode 20. The film 14 may be one color, for example, green, or may have multiple concentric areas of different colors further to enhance resolution of the display 44. In some instances, it may be desirable to print generally concentric circular gradations on the film 14 at the center of the display 44 to facilitate a visual reading of the voltage level supplied by the battery. The temperature responsive display 44 includes two thermochromic materials 46 and 48 one atop the other on the surface of the film 14 opposite the zener diode 20. The thermochromic materials 46, 48 are preferably configured in a rectangular shape with the thermochromic material 48 being immediately adjacent the film 14 and the thermochromic material 46 lying directly atop the thermochromic material 48. The thermochromic layers 46, 48 are chosen with dissimilar transition temperatures and preferably different colors in their opaque states. For example, the thermochromic layer 48 directly adjacent the film 14 may have a transition temperature of 60° C. and an opaque color of red, while the thermochromic layer 46 remote from the film may have a transition temperature of 45° C. and a black opaque color below the transition temperature. In use, the temperature responsive display 44 will appear black if the voltage supplied by the battery 24 is below the threshold voltage of zener diode 20, but will exhibit a bullseye pattern if the voltage supplied is significantly above the threshold voltage of the zener diode, as is described just below.

In the embodiment of FIGS. 4 and 5, for voltages supplied to the zener diode 20 by the battery 24 substantially above the threshold conducting voltage of the diode, the diode will generate sufficient heat, once conducted through the film 14, to elevate the temperature of the temperature response display 44 above the transition temperatures of the thermochromic materials 46, 48. In such an instance, a large relatively circular area 46a of the thermochromic material 46 will change to a transparent state permitting viewing of the thermochromic material 48 beneath it. (In FIG. 4 the dashed lines indicate boundaries across which the thermochromic material transitions from opaque to transparent.) The thermochromic material 48, having a higher transition temperature than the thermochromic material 46, will also change to a transparent state but over a smaller generally circular area 48a centered in the display 44, thus allowing viewing of the green film 14 therebelow. Consequently, for a fully charged battery the temperature responsive display 44 will appear as a bullseye pattern having a relatively large generally circular area of the green film 14 visible. At slightly depleted battery charges, the battery will supply the zener diode 20 with a somewhat lesser voltage above the threshold voltage, and thus the diode will generate somewhat less heat than in the fully charged condition. This will in turn cause the thermochromic materials 46 and 48 to reach their transition temperatures over somewhat smaller circular areas centered on the display 44. Thus at a slightly reduced charge for the battery, the display 44 may indicate a bullseye pattern with a very small green area of the film 14 visible. At even lesser charges for the battery, the zener diode 20 may not generate sufficient heat to elevate the thermochromic material 48 above its transition temperature yet a small portion of the thermochromic material 46 may still be at a sufficiently high temperature to transition to its transparent state. In this case, the temperature responsive display 44 will appear as a black rectangular area with a circular area centered in the display 44 through which the thermochromic material 48 in its red opaque state is visible. For a fully depleted battery, the voltage generated by the battery will fall below the threshold voltage of the zener diode 20, and the diode will effectively turn off current flow through the circuit thus leaving the temperature responsive display 44 substantially unheated and in its completely black state.

Figure 6:
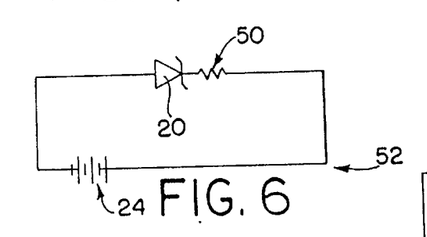
FIG. 6 is a schematic circuit diagram of a battery tester in accordance with an alternate embodiment of the present invention including a current limiting resistor.

In order to protect the zener diode 20 from suffering damage due to an excessive current being applied across the diode, a current limiting resistor 50 may be placed in series with the zener diode 20, as is shown in the circuit 52 illustrated in FIG. 6. The current limiting resistor 50 may be the resistance characteristic of one of the conductive strips 16. Alternatively, the resistor 50 may be one or more separate resistor(s), for example, printed on or attached to the film 14, or otherwise formed and in any event connected in circuit with the diode 20. The current flowing through the circuit 52 is a function of the voltage $V_{batt}$ impressed across the zener diode 20 exceeding the threshold conducting voltage $V_{thresh}$ of the diode, the internal resistance of the diode $R_z$ and the resistance of the current limiting resistor $R_{CLR}$. As a result, the amplitude of current I allowed to flow through the circuit 52 can be controlled by the resistance value of current limiting resistor 50 employed in the circuit. For example, if the zener diode has a threshold voltage $V_{thresh}$ of 12 volts and an internal resistance $R_z$ of 2 ohms and the battery $V_{batt}$ generates 14 volts, employing a 12 ohm current limiting resistor 50 in the circuit 52 would result in a current through the circuit as follows:

$$I = \frac{V_{batt} - V_{thresh}}{R_{CLR} + R_Z} = \frac{14 - 12}{10 + 2} = 167 \text{ milliamps}$$

Such a current is sufficiently low to not damage the electrical components of the battery tester.

However, as the heat generated by the zener diode 20, which causes the temperature responsive display to assume a certain visual readout, is a function of the current across the zener diode as well as the internal resistance of the diode, the reduction of current through the device as a result of addition of the current limiting resistor 50 must be accounted for in the selection of proper thermochromic materials in the temperature responsive display. Further, the current limiting resistor 50 also generates heat as a function of the current through the resistor and its resistance. Consequently, the current limiting resistor 50 must have a sufficiently large surface area to dissipate enough of the generated heat to prevent damage to the device.

Another advantage to using a current limiting resistor in a battery tester circuit is that it can be implemented as a thin film resistor and used as a trimming resistor to compensate for variations in the actual threshold conducting voltage of the zener diode from the design threshold conducting voltage. A typical tolerance on the threshold conducting voltage for a silicon zener diode is plus or minus 5% or higher. Consequently, for a battery tester designed to measure relatively higher voltages, for example 12 to 60 volts, the variation in the threshold conducting voltage for the zener diode from the design voltage may result in an unacceptable shift in the operating parameters of the battery tester. In production, the threshold voltage of the zener diode in an assembled battery tester can be measured using an ammeter. If the zener diode conducts electricity at too low of a voltage, a small hole can be punched in the current limiting resistor to raise the resistance of the current limiting resistor thus reducing current flow through the tester and effectively shifting the threshold conducting voltage of the zener diode higher. In a sense, then, the current limiting resistor 50 may be considered a trim resistor to facilitate such circuit adjustment and/or compensation.

While the typical tolerances on the threshold conducting voltage of a silicon zener diode are relatively high when diodes are purchased commercially, a single wafer may produce hundreds of thousands of zener diodes having essentially the same threshold conducting voltage. Consequently, it may be desirable to assemble battery testers in runs using zener diodes manufactured from the same wafer. In this case, since the threshold conducting voltage of the zener diode to be assembled into the battery tester is known accurately, the battery tester can be assembled with a current limiting resistor 50 with an ohm value tailored to the accurately known threshold conducting voltage of the zener diode. The current limiting resistor is thus essentially "trimmed" prior to production, and it is not necessary to further adjust the resistance of the current limiting resistor during production.

A further advantage to employing a current limiting resistor is to provide protection to the diode and other electrical components of the battery tester if the battery tester is connected to a battery in the wrong polarity. A zener diode has a very low resistance when employed in a circuit counter to its intended direction. Further, when employed in the opposite direction, the zener diode does not exhibit a threshold voltage and thus does not bias the circuit. Hence, without employing a current limiting resistor, a significantly higher current is drawn through the circuit than when the battery tester is connected in the correct direction. For example, in the wrong direction the zener diode may have a resistance of 1 ohm and since the 14 volt supply of the battery then is not effectively biased by the zener diode, the current through the circuit is:

$$I = \frac{V_{batt}}{R_Z} = \frac{14}{1} = 14 \text{ amps}$$

Figure 7:
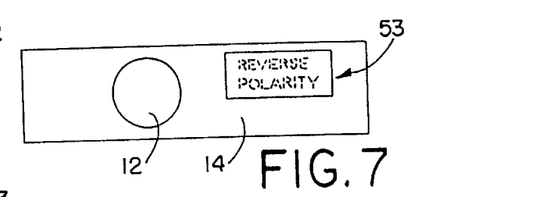
FIGS. 7 and 8 illustrate visual states of an exemplary temperature responsive display used to provide a visual indication as to whether the battery tester is connected in the correct polarity.
Figure 8:
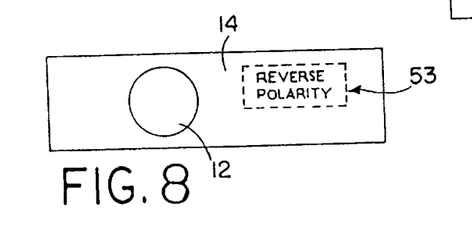

This excessive current could burn out the printed conductors or zener diode. By employing a current limiting resistor in the circuit of the battery tester not only is a degree of protection provided to the electrical components of the battery tester, but the current limiting resistor can be used to provide a visual indication that the battery tester is connected in reverse polarity. Since more current is drawn through the circuit when the battery tester is connected to a battery at the wrong polarity the current limiting resistor 50 will generate a significant amount of heat which can be used to operate a temperature responsive display 53 to provide a visual indication that the connection polarity is reversed. In such an instance, the temperature responsive display 53 may include a thermochromic material disposed upon an area of the film having been printed with a pattern such as the words "reverse polarity" or another graphic display covering a similar message. The temperature responsive display 53 would then appear opaque when the battery tester is not connected to a battery or is connected in the correct polarity as illustrated in FIG. 7 (the dashed lines indicating a pattern which is obstructed from view by the opaque temperature responsive display). However, when connected in the wrong polarity, the current limiting resistor 50 will heat the temperature responsive display 53 to a sufficient temperature to cause the thermochromic material of the display to transition to a transparent state to indicate the words "reverse polarity" as illustrated in FIG. 8.

Figure 9A:
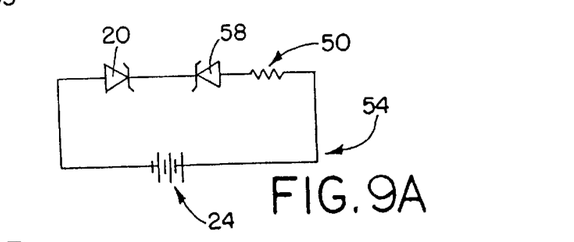
FIG. 9A is a schematic circuit diagram of an alternate embodiment of the battery tester of the present invention including multiple zener diodes in opposite directions in the circuit.

It is also possible to provide additional protection to the battery tester against damage which could be caused by connecting the battery tester to a battery in the wrong polarity by including in series with the diode 20 and the current limiting resistor 50, a second zener diode 58 in opposite direction to the zener diode 20 as is schematically illustrated in the circuit 54 of FIG. 9A. When a battery tester configured as is illustrated in the circuit 54 is connected to a battery in the correct polarity, the battery tester functions in the same manner as described above relative to the circuit 52 illustrated in FIG. 6, with the second zener diode 58 providing little resistance to current flow and no voltage biasing of its own. However, if a battery tester configured as is illustrated in circuit 54 is connected to a battery with the polarity reversed, the second zener diode 58 limits the current flow through the circuit as a function of the voltage of the battery 24 exceeding the threshold conducting voltage of the second zener diode 58 and the internal resistance of the second zener diode and the resistance of the current limiting resistor 50. When such a battery tester is connected to a battery in reverse polarity the second zener diode 58 acts as the first zener diode did relative to circuit 52 in FIG. 6 when connected in the correct polarity. Similarly, the first zener diode 20, being in reverse polarity, will exhibit no voltage biasing and little internal resistance as did the second zener diode 58 when the battery tester was connected in the correct polarity. Consequently, the zener diode 58 will generate sufficient heat when placed in thermal contact with a second temperature responsive display to produce a visual indication that the battery tester is connected in the wrong polarity. Alternatively, substantially identical temperature responsive displays may be placed in thermal contact with each of the zener diodes 20 and 58 to provide a battery tester which functions the same regardless of the polarity. It is also possible to substitute a single bipolar zener diode for the two zener diodes illustrated in FIG. 9A.

Figure 9B:
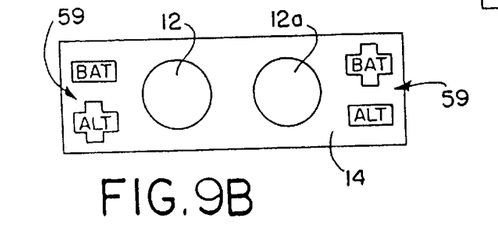
FIG. 9B is a top view of a battery/alternator tester for testing the charge of a battery when connected to the battery in one direction and for testing the charge generated by an alternator when connected in the reverse direction.

The embodiment of the invention employing two zener diodes in opposite directions as depicted in circuit 54 of FIG. 9A can also be used to provide a combined battery tester and alternator tester. When the desired application of the invention is for automotive uses, the zener diode 58 can be selected to have a threshold voltage slightly below the voltage which a properly functioning alternator would generate when the car is running. A typical automotive alternator produces a charging current to the battery that is generally one or two volts higher than the peak battery voltage. Therefore, a zener diode 58 having a threshold voltage slightly greater than the peak battery voltage would be used in the circuit 54. An illustration of an exemplary battery/alternator tester is shown in FIG. 9B. The tester includes a temperature responsive display 12 thermally coupled with the zener diode 20 of FIG. 9A for displaying the charge state of the battery as described above. A second temperature responsive display 12a is thermally coupled to the zener diode 58 of FIG. 9A and provides a visual display of the functioning of the alternator. The battery/alternator tester is further provided with labels 59 printed on the upper surface of the film 14 above the regions providing electrical contact with the terminal of the battery to illustrate to a user in which polarity to connect the tester to the terminals of the battery.

When the tester is connected to the battery in a polarity to test the battery the zener diode 20 acts to heat the temperature responsive display 12 to provide a visual display of the charge of the battery. In this instance the zener diode 58 has little impact in the circuit 54 and does not generate sufficient heat to elevate the temperature of the temperature responsive display 12a significantly enough to cause a visual change in the display 12a. When the car in which the battery is employed is running so that the alternator is generating a charging current to the battery, and the tester is attached to the battery in the opposite polarity of that for the battery test, the zener diode 58 is oriented with respect to the current flow to produce heat to cause the display 12a to visually indicate the functioning of the alternator. Since an alternator generally functions well or not at all, the display 12a usually need not indicate a continuum of states as may be desirable for the battery testing, but may include a single thermochromic material to indicate that the alternator is functioning or not. As an alternative to using two zener diodes 20, 58 in the tester circuit 54 of FIGS. 9A/9B, a bipolar zener diode having different respective threshold voltages for respective polarities may be used.

Figure 10:
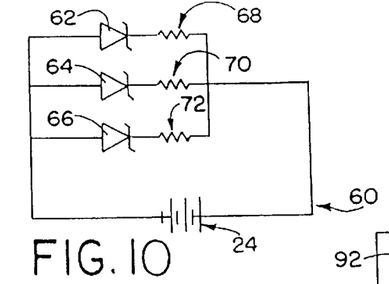
FIG. 10 is a schematic circuit diagram of an alternate embodiment of a battery tester in accordance with the present invention including multiple diodes in parallel.

In some instances it may be desirable to employ multiple zener diodes having different threshold voltages in the battery tester to facilitate detection of different voltage levels for a battery. A schematic illustration of a circuit 60 employing multiple zener diodes 62, 64 and 66 is shown in FIG. 10. The zener diodes 62, 64 and 66 are connected parallel to each other and each has a current limiting resistor 68, 70 and 72, respectively, in series with the zener diode. Separate temperature responsive displays thermally coupled with each zener diode 62, 64, 66 can then be used to produce a visual indication when the associated zener diode is supplied with a voltage exceeding its threshold voltage. A battery tester employing multiple diodes in an arrangement such as that shown in FIG. 10 can be used to provide separate readouts for discrete voltage levels of the battery which accurately indicate the charge level of the battery being tested.

Figure 11:
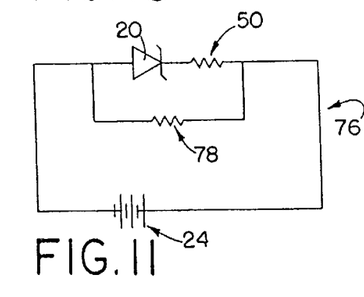
FIG. 11 is a schematic circuit diagram of an alternate embodiment of a battery tester in accordance with the present invention including a resistance heating element which detects when the battery tester is connected to a battery.

A further embodiment of a battery tester in accordance with the present invention is illustrated in the schematic circuit diagram of FIG. 11. The circuit 76 illustrated in FIG. 11 is similar to that illustrated in FIG. 6 with the addition of a resistance heating element 78 electrically connected in parallel with the zener diode 20 and current limiting resistor 50. An additional temperature responsive display is preferably associated with the resistance heating element 78 and thermally coupled therewith to indicate that contact has been made between the battery and the battery tester. When the battery tester is electrically connected with the battery 24, electrical current will flow through the circuit 76 and through the resistance heating element 78 thus heating the temperature responsive display associated therewith. By employing appropriate thermochromic materials which have relatively low transition temperatures in the temperature responsive display, the display can be made to indicate visually that electrical connection has been made with the battery.

Figure 12:
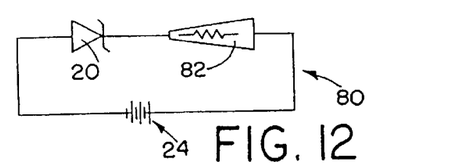
FIG. 12 is a schematic circuit diagram of an alternate embodiment of the battery tester of the present invention including a tapered resistance heating element.

Another embodiment of a battery tester is illustrated in the schematic circuit diagram of FIG. 12. The circuit 80 of FIG. 12 includes a zener diode 20 and a tapered heating resistance element 82 in series with the zener diode and a battery 24. In this embodiment the temperature responsive display is located in thermally coupled relation with the tapered resistance heating element 82 rather than with the zener diode 20. The temperature responsive display and tapered resistance heating element may be similar to those packaged with Duracell® batteries. When the battery 24 is depleted and is only capable of impressing across the circuit 80 a voltage which is less than the threshold conducting voltage of the zener diode 20, there will be substantially no current flow through the circuit 80 and the resistance heating element 82. Consequently, the temperature responsive display will not change from its state when the battery tester is not connected to a battery. When the battery 24 is charged sufficiently to impress upon the circuit 80 a voltage exceeding the threshold voltage of the zener diode 20, a current, which is a function of the voltage of the battery 24 exceeding the threshold conducting voltage of the diode and the internal resistance of the diode and the resistance of the tapered resistance heating element 82, will cause the resistance heating element to dissipate heat as a function of that current and the resistance of the resistance heating element. For voltages of the battery 24 exceeding the threshold voltage of the zener diode 20 only slightly, a relatively small area of the tapered resistance heating element 82 having a small cross-sectional area will generate sufficient heat to cause the thermochromic materials in the temperature responsive display to transition to their transparent states. For greater voltages exceeding the threshold voltage of the zener diode 20, a larger portion of the tapered resistance heating element 82 including sections having relatively larger cross-sectional areas will generate sufficient heat to cause greater corresponding portions of the thermochromic materials in the temperature responsive display to transition to their transparent states. Consequently, by using a zener diode 20 in series with the tapered resistance heating element 82 and temperature responsive display, a battery tester can be made to provide a relatively accurate response over a small voltage range through the biasing action of the zener diode.

Figure 13:
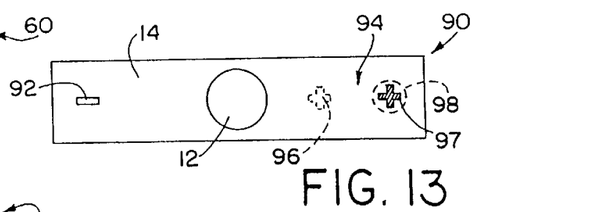
FIG. 13 is a top view of a battery tester in accordance with one embodiment of the present invention including temperature compensating abilities shown as the battery tester would appear at temperatures above a certain ambient temperature.
Figure 14:
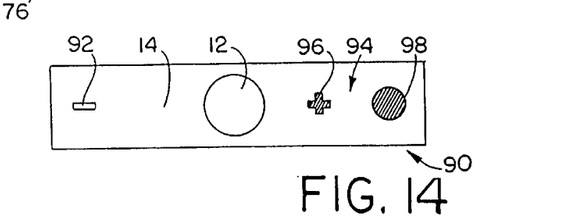
FIG. 14 is a top view of a battery tester in accordance with one embodiment of the present invention including temperature compensating abilities shown as the battery tester would appear at temperatures below a certain ambient temperature.

A further embodiment of a battery tester is illustrated in FIGS. 13 and 14. The battery tester 90 is constructed similar to the battery tester of FIG. 1 with a temperature responsive display 12 and a thin polyester film 14 as well as conductive leads and a zener diode (not shown). The battery tester 90 further includes a designation 92 in the form of a minus sign printed on the surface of the film 14 opposite from the conductive strips indicating where the battery tester is to be applied to the negative terminal of a battery. The conductive strips have a resistance per unit length which can be used to add resistance to or subtract resistance from the overall circuit based upon where along the length of the conductive strip that the terminal of the battery contacts the conductive strip. The battery tester 90 additionally includes an ambient temperature responsive indicator 94 to designate the area where the battery tester should be connected to the positive terminal of a battery. The ambient temperature responsive indicator 94 includes at least two discrete sections 96 and 97. Which portion of the indicator 96 or 97 which is in the form of a plus sign is determined by the ambient temperature. The indicator 97 is in the form of a plus sign printed directly upon the film 14. The indicator 97 is covered by a thermochromic material 98. A thermochromic material similar to the thermochromic material 98 used to cover the indicator 97 is used to form the indicator 96, also configured as a plus sign.

Since the temperature of the temperature responsive display 12 is dependent not only on the heat supplied by the zener diode 20 but also heat supplied by the ambient surroundings, under some conditions it may be necessary for the zener diode to generate more or less heat in order to achieve the desired response from the temperature responsive display 12. For example, at low ambient temperatures more heat is required from the zener diode 20 to elevate the temperature responsive display 12 above the transition temperatures of the thermochromic materials to achieve the desired response for a given battery voltage than is required at higher ambient temperatures. One method of compensating for this difference in ambient temperature is by choosing appropriate thermochromic materials for the ambient temperature responsive indicator 94 which have transition temperatures at the desired ambient temperature to designate different contact points for the positive terminal of the battery as a function of the ambient temperature and therefore to alter the overall resistance of the battery tester corresponding to the portion of the conductive strip participating in the battery tester circuit. For example, the thermochromic material 98 covering the indicator 97 and the thermochromic material used to form the indicator 96 may have a transition temperature of 20° C. Accordingly, as is shown in FIG. 13 when the ambient temperature is above 20° C., the indicator 96 will be in a transparent state and nearly invisible and the thermochromic material 98 covering the indicator 97 will also be transparent allowing the indicator 97 to be visible. (Dashed lines in FIGS. 13 and 14 show that an indicator 96 or 97 is transparent, while a visible indicator is shown by shading.) As the indicator 97 is located further away from the temperature responsive display 12 and the zener diode 20, a greater portion of the conductive strip will participate in the circuit and thus the resistance of the overall circuit formed by the battery and the battery tester will be relatively high thereby decreasing the current flow through the battery tester and the heat generated by the zener diode. Conversely, for temperatures below 20° C. the thermochromic material forming the indicator 96 will be below its transition temperature and the indicator 96 will be visible. Similarly, the thermochromic material 98 covering the indicator 97 will also be below its transition temperature and will be in an opaque state thus covering the indicator 97 from view. Since the indicator 96 is closer to the temperature responsive display 12 and zener diode 20, there is less of the conductive strip participating in the circuit and thus less resistance in the circuit formed by the battery tester 97 and an attached battery. Therefore, more current will flow through the battery tester 90 and zener diode 20, and the zener diode will generate more heat thus compensating for the lower ambient temperature.

Figure 15:
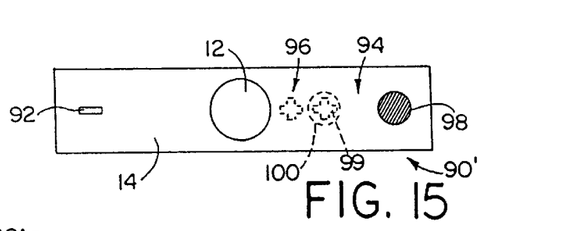
FIG. 15 is a top view of a modified battery tester similar to the battery tester shown in FIGS. 13 and 14 but using three indicators for indicating connections to provide for ambient temperature compensation abilities; a conductive strip having resistive characteristics.

As is depicted in FIG. 15, in instances where the ambient temperature varies over a large range of temperatures, it may be desirable to employ in a tester 90' three or more contact indicators (three being shown in FIG. 15), such as indicators 96 and 97, which were discussed above relative to FIGS. 13 and 14, and contact indicator 99, to provide compensation for the effect of the ambient temperature on the temperature responsive display and/or on the voltage source, e.g., battery 24, an alternator, etc. The indicator 97 is in the form of a plus sign printed directly upon the film 14. The indicator 97 is covered by a thermochromic material 98. A thermochromic material similar to the thermochromic material 98 used to cover the indicator 97 is used to form the indicator 96, also configured as a plus sign.

The indicator 99 is in the shape of a plus sign and it may be formed of a thermochromic material similar to the thermochromic material 98 used to cover the indicator 97. The indicator 99 may be printed on or otherwise applied to the film 14. The indicator 99 is covered by a thermochromic material 100, as the indicator 97 was covered by thermochromic material 98. In an exemplary embodiment, the thermochromic material 98 may be selected of a material that is opaque at temperatures below +5° C. so as to obscure the plus sign indicator 97. Therefore, when the ambient temperature is at 5° C. and above, the indicator 97 is visible, and a user of the battery tester 90' would be expected to place the contact located beneath the indicator 97 into engagement with the positive terminal of the voltage source intended to be tested. (In FIG. 15 the indicator 99 and the cover material 100 are shown in dashed lines because each can be transparent or opaque as a function of the temperature thereof.)

In the exemplary embodiment of the tester 90' the thermochromic material of the indicator 99 may be selected to be opaque at temperatures below +5° C. so as to be visible on the film 14 and to be transparent and, thus, invisible, at temperatures of +5° C. and above. Also, the thermochromic material of the covering 100 for the indicator 99 may be selected to be opaque at temperatures below +0° C. so as to obscure the indicator 99 and to be transparent and, thus, invisible, at temperatures of +0° C. and above to permit the viewing of the indicator 99. Therefore, when ambient temperature is between just below +5° C. (so that the indicator 99 is visible) and just above 0° C. (so that the covering 100 does not obscure the indicator 99, the indicator 99 will appear as a plus (+) sign to signify to the user of the tester 90' to place the positive contact of the voltage source in engagement with the contact just below the indicator 99.

Also, in the exemplary embodiment of the tester 90' the thermochromic material of the indicator 96 may be selected to be opaque at temperatures below +0° C. so as to be visible on the film 14 and to be transparent and, thus, invisible, at temperatures of +0° C. and above. As is shown in FIG. 13 when the ambient temperature is 0° C. and above, the indicator 96 will be in a transparent state and nearly invisible and when the ambient temperature is below 0° C. the indicator 96 will be visible to indicate the place for connection of the tester 90' to the positive contact of the voltage source.

Figure 16:
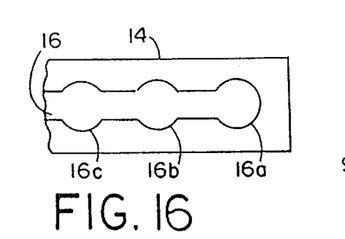
FIG. 16 is a fragmentary top view of an alternate embodiment of a battery tester of FIG. 15 using three contacts and a conductive strip having resistive characteristics.
Figure 17A:
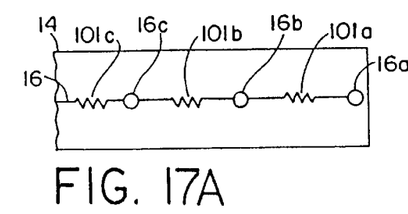
FIG. 17A is a fragmentary top view of another embodiment of a battery tester of FIG. 15 using three contacts and three series connected resistors.
Figure 17B:
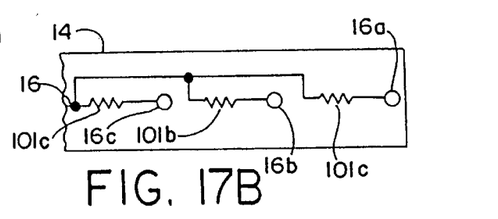
FIG. 17B is a fragmentary top view of another embodiment of a battery tester of FIG. 15 using three contacts and three resistors connectable in circuit with the electrical heating element.
Figure 18:
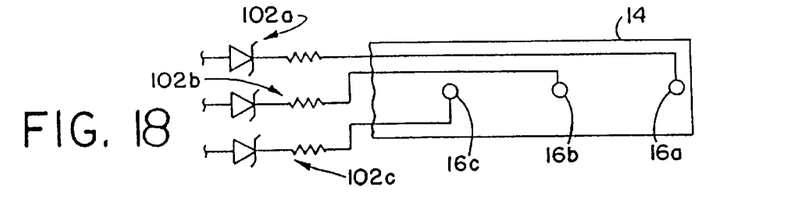
FIG. 18 is a fragmentary top view of a further embodiment of a battery tester of FIG. 15 using three contacts for selectively connecting for use three circuits of resistors and electrical heating elements.

Briefly referring to FIGS. 16, 17 and 18, three respective exemplary arrangements of contacts 16a, 16b, 16c, are shown corresponding to the three indicators 96, 97 and 99 on the opposite surface of the film 14. In these figures a fragmentary portion of the film 14 and of components of respective battery testers designated 90' are shown.

In FIG. 16 the contacts 16a, 16b, 16c are located along the conductive path 16, which has a resistance characteristic. When the positive terminal of the voltage source 24, for example, is connected to contact 16a, due to an appropriate indication from indicator 97 (and not from the other indicators 96 or 99), maximum resistance is connected in series with the zener diode 20, for example. On the other hand, when the positive terminal of the voltage source is connected to contact 16c, minimum resistance is connected in series with the zener diode 20. In the latter case, since ambient temperature is at a relative minimum, it is likely to be desirable that the zener diode conduct maximum current to maximize heating of the associated thermochromic display to obtain the desired output thereof indicating the condition of the voltage source. When the positive terminal of the voltage source 24 is connected to contact 16b, due to an appropriate indication from indicator 99 (and not from the other indicators 96 or 97), an intermediate level of resistance is connected in series with the zener diode 20.

It will be appreciated that the amount of resistance connected in circuit with the zener diode 20 may be selected to compensate for ambient temperature that will affect the thermochromic display. Alternatively and/or in addition, the amount of resistance connected in circuit with the zener diode 20 may be selected to compensate for ambient temperature that will affect the characteristics of the zener diode itself and/or of the voltage source.

In FIG. 17A the three contacts 16a, 16b, 16c are connected relative to resistors 101a, 101b, and 101c, which are connected in electrical series. The resistors may be of the same or different resistances. As was described above, when the positive terminal of the voltage source 24, for example, is connected to contact 16a, due to an appropriate indication from indicator 97, maximum resistance is connected in series with the zener diode 20, e.g., due to a condition of relatively maximum ambient temperature in which the tester 90' is expected to be used. On the other hand, when the positive terminal of the voltage source is connected to contact 16c, minimum resistance is connected in series with the zener diode 20, thus compensating for relatively minimum ambient temperature as above. Connection to the contact 16b provides an intermediate resistance value in series with the zener diode.

As an alternative to the series connection of resistors 101a, 101b, and 101c, each may be connected at one end or terminal to a common node connection with the conductive strip 16 and at the respective opposite end or terminal to a respective contact 16a, 16b, 16c, as is shown in FIG. 17B. In such case, each resistor would be of a different value, the one connected between node at the conductive strip 16 and the contact 16c having the smallest value of resistance, the one between the node and the contact 16b being of an intermediate value, and the one between the node and the contact 16c being of largest value.

In FIG. 18 the three contacts 16a, 16b, 16c are connected relative to respective circuits 102a, 102b, 102c, each including a zener diode and a resistor. The resistors of such circuits 102a, 102b, 102c may be for compensation, current limiting and zener diode protection and/or for trimming as resistor 50 described above. The zener diodes of the respective circuits 102a, 102b, 102c also may have different respective characteristics, e.g., threshold voltage as a function of temperature, etc. to provide the desired compensation or adjustment as a function of ambient temperature to obtain proper operation of the tester 90'.

Figure 19:
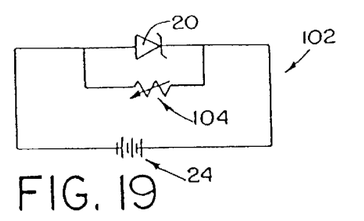
FIG. 19 is a schematic circuit diagram of a battery tester in accordance with an embodiment of the present invention provided with a heater element.

Another manner of providing compensation for ambient temperatures is to employ an element in the system which heats the temperature responsive display to a consistent absolute temperature regardless of the ambient temperature. Such a heater element would typically exhibit a positive temperature coefficient of resistance over a range of temperatures with an abrupt increase in resistance as the element reaches a certain absolute temperature. An example of such a heater element is marketed by Raychem Corporation as "Polyswitch". Thermochromic materials for the temperature responsive display 12 are then chosen with transition temperatures somewhat above the absolute temperature to which the heater element heats the zener diode. A circuit diagram for such an ambient temperature compensation system is illustrated in FIG. 19. The circuit 103 of FIG. 19 includes a battery 24 and a zener diode 20 electrically in parallel with a heater element 104. As current flows through the circuit the heater element generates heat increasing its temperature and the temperature of the zener diode 20 and adjacent temperature responsive display 12 (not shown). Once the temperature of the heater element 104 has reached a certain absolute temperature its resistance increases abruptly so that current predominately flows only through zener diode 20. Heating of the zener diode 20 and the temperature responsive display 12 above this point is then by the resistance heating effect of the zener diode. The heater element 104 can be an ink which may be screen printed on the thin film 14 adjacent the zener diode.

Figure 20:
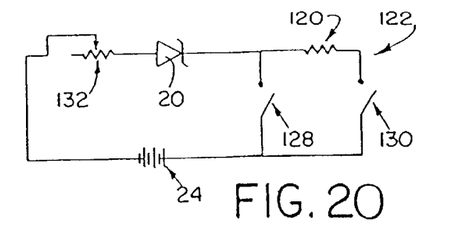
FIG. 20 is a schematic circuit diagram of a battery/alternator tester in accordance with an embodiment of the present invention employing a current limiting resistor.

A battery/alternator tester can also be accomplished using the diode 20 and a current limiting resistor 120 which participates in the circuit 122 of FIG. 20 only when the alternator is being tested. The current limiting resistor 120 increases the overall resistance of the circuit 122 and thereby reduces the current flow through the zener diode 20 which can be used to generate heat to drive the temperature responsive display 12. The current limiting resistor 120 is chosen to have a resistance value which reduces the current flow through the zener diode 20 sufficiently that the tester is operable to test the slightly higher voltage of the charging signal generated by the alternator when the car is running. In this way the current limiting resistor 120 effectively shifts the threshold conducting voltage of the diode 20 to a higher value.

Figure 21:
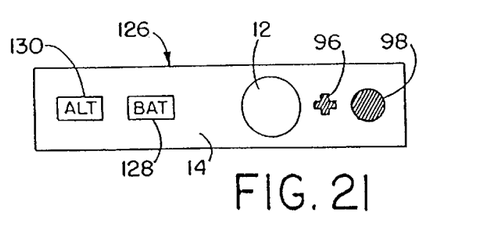
FIG. 21 is a top view of the battery/alternator tester schematically illustrated in FIG. 20.

FIG. 21 shows a top view of a battery/alternator tester 126 in accordance with this embodiment of the invention. The tester 126 includes a temperature responsive display 12 thermally coupled to the zener diode 20 and a pair of contact indicators 128 and 130 indicating where the tester 126 is to be placed in contact with the negative terminal of the battery 24 when the tester is testing the battery or the alternator, respectively. When the tester 126 is to be used for testing the battery, the tester is placed in contact with the negative terminal of the battery in the contact region directly below the indicator 128. In this instance, the current limiting resistor 120 does not participate in the circuit 122 and the circuit takes the form as shown in FIG. 20 with the contact 128 in the closed position. When the tester 126 is to be used to test the alternator, the tester is placed in contact with the negative terminal of the battery in the contact region directly below the indicator 130. This results in the effective circuit 122 shown in FIG. 20 with contact 130 closed and contact 128 open, thus causing the current limiting resistor 120 to participate in the circuit.

Figure 22:
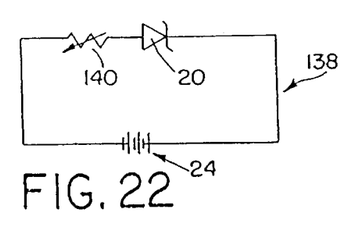
FIG. 22 is a schematic circuit diagram of a battery tester in accordance with one embodiment of the present invention including over-current protection.

The tester 126 may also be provided with the ability to compensate for ambient temperature effects by using temperature responsive contact indicators 96, 97 as described above relative to FIGS. 13 and 14 or the heater element 104 discussed above relative to FIG. 19. (The variable resistance provided in the circuit 122 by the use of the contact indicators 96 and 97 or more contact indicators to vary the resistance provided to the circuit as a function of the ambient temperature is illustrated in FIG. 20 as the variable resistor 132.) A further embodiment of a circuit for a battery tester including over-current protection is illustrated in FIG. 22. The circuit 138 includes in electrical series a battery 24, a zener diode 20 and an electrical element 140, like the heater element 104 described immediately above relative to FIG. 19, which exhibits a large increase in resistance as the element is heated near a certain temperature. An example of such an element 140 is marketed by Raychem Corporation as "Polyswitch". The element 140 is thermally coupled to the zener diode 20. Consequently, if a battery tester employing the circuit 138 is connected to a battery in the wrong polarity, as the zener diode 20 generates heat as a function of the unbiased voltage across the diode, the dissipated heat will heat the element 140. As the temperature of the element 140 nears a certain point its resistance will increase greatly, for example from 0.1 ohms to 10 ohms, thus enabling the element to function as a current limiting resistor and preventing damage to the components of the circuit. It may also be desirable to thermally couple a temperature responsive display, such as those discussed above in conjunction with current limiting resistors, to the element 140 to provide a visual indication when the battery tester is connected in the wrong polarity.

Figure 23:
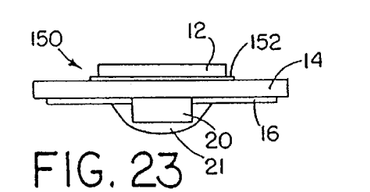
FIG. 23 is an elevation view of a battery tester including a thermally conductive layer to improve radial heat transfer over a temperature responsive display.

FIG. 23 illustrates an embodiment of a battery tester 150 which includes a thermally conductive layer 152 interposed between the polyester film 14 and the temperature responsive display 12. The thermally conductive layer 152 increases heat conduction radially outwardly from the center of the zener diode 20 and display 12 thus causing heat generated by the zener diode 20 to be transferred to a larger area of the display 12. The thermally conductive layer 152 is preferably electrically non-conductive and alternatively may be placed on the side of the film 14 adjacent the zener diode 20 or on both sides of the film.

Figure 24:
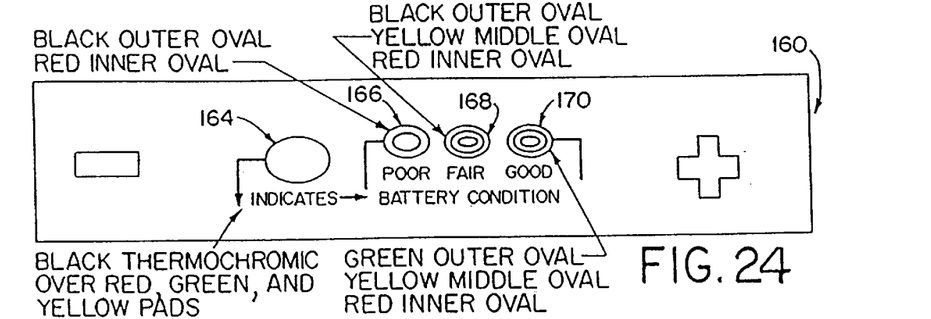
FIG. 24 is a top view of a battery tester employing icons to facilitate a determination of battery condition.
Figure 25:
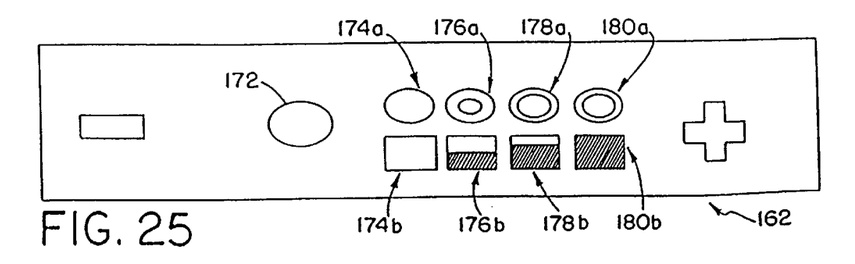
FIG. 25 is a top view of a battery tester in accordance with another embodiment employing icons to facilitate determination of battery condition.

FIGS. 24 and 25 show alternate embodiments of battery testers 160, 162 employing icons which facilitate a visual analysis of the condition of the battery being tested. The battery tester 160 shown in FIG. 24 includes a temperature responsive display 164 composed of an oval of a black thermochromic material overlying concentric colored ovals, with the innermost oval being red, the middle oval being yellow and the outermost oval being green, for example. When the oval of thermochromic material is heated by the zener diode, the thermochromic material reaches a state with the center of the oval being the hottest and the outermost portion of the oval being coolest. The actual temperatures which the thermochromic material will reach over the oval, and thus the portion of the oval of black thermochromic material which will reach its transition temperature and turn transparent, will depend on the condition of the battery being tested.

For a battery with a relatively poor charge, only a small portion of the thermochromic material near the center of the oval will transition to a transparent state, thus permitting only the red inner oval to be seen. This condition of the battery is illustrated by the icon 168 which is labelled as "POOR". For a battery which has a somewhat better charge, a larger area of thermochromic material will reach its transition state allowing a layer area of the colored ovals to be seen, for example, the red inner oval and the yellow middle oval. The outer oval will remain black as this portion of thermochromic material has not reached its transition temperature. This condition of the battery is represented by the icon 168 which is labelled "FAIR". For a well charged battery substantially the whole area of black thermochromic material will reach its transition temperature allowing all three concentric ovals to be see, e.g., the red inner oval, the yellow middle oval and green outer oval. This battery condition is shown in the icon 170 which is labelled "GOOD". Thus, by comparing the temperature responsive display 164 with the icons 166, 168 and 170, the user can readily determine the state of the battery by reading the battery condition associated with the icon which most closely matches the appearance of the temperature responsive display.

The battery tester 162 shown in FIG. 25 includes a temperature responsive display 172 which may be the same as the display 164, any of the other temperature responsive displays disclosed herein, or of a different configuration which conveys visual information to the user about the state of the battery being tested. The specific embodiment of the temperature responsive display 172 of the tester 162 includes an oval of black thermochromic material over a single colored oval, for example, red. Depending on the state of the battery tested, anywhere from a small portion to a large portion of the red oval may be visible through the thermochromic material which has transitioned to its transparent state. The user compares the appearance of the temperature responsive display 172 with the upper of the paired icons 174a, 176a, 178a and 180a to determine the closest match. Once the display 172 has been matched with the closest appearing upper icon 174a, 176a, 178a or 180a, the user then looks to the corresponding lower icon 174b, 176b, 178b or 180b to ascertain the battery level. The lower icons 174b, 176b, 178b and 180b, in this example, each resemble a car battery with a progressively larger colored portion therein indicating the level of charge of the battery.

Figure 26:
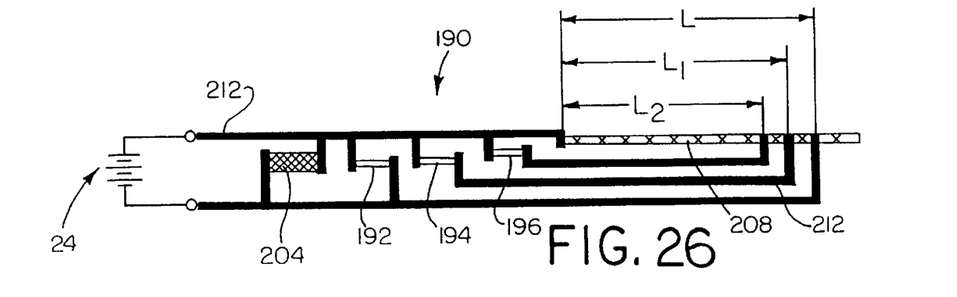
FIG. 26 is a plan view of a battery tester in accordance with one embodiment of the invention.
Figure 27:
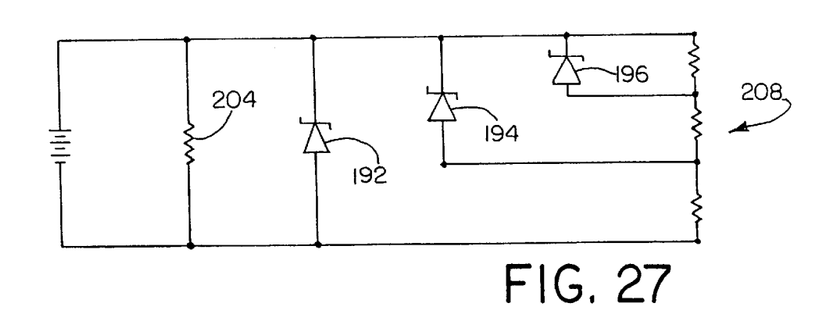
FIG. 27 is an electrical schematic diagram of the battery tester of FIG. 26.
Figure 28:
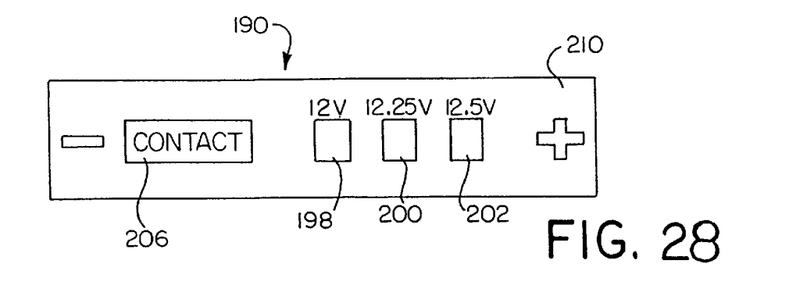
FIG. 28 is a top view of the display of the battery tester of FIG. 26.

A battery tester 190 including a discrete bar graph in accordance with one embodiment of the present invention is shown in FIGS. 26 through 28. FIG. 26 is a plan view of the battery tester 190 which includes a number of separate zener diodes 192, 194 and 196 electrically connected in parallel for sensing different voltages of a voltage supply, such as the battery 24. The equivalent electrical circuit is shown in the circuit diagram of FIG. 27. Each zener diode 192, 194 and 196 is thermally coupled to a separate temperature responsive display 198, 200 and 202, respectively, shown in FIG. 28 which is a top view of the battery tester 190, for providing a visual indication of the voltage level of the battery 24. A resister 204 in parallel with the zener diodes 192, 194 and 196 is thermally coupled to a temperature responsive display 206 which provides a visual indication that the battery tester 190 is electrically connected to the terminals of the battery 24.

A printed resister 208 having a length "L" is connected in parallel with the zener diode 192. Somewhat shorter portions "$L_1$" and "$L_2$" of the printed resister 208 are connected in parallel with the zener diodes 194 and 196, respectively, with the remaining portions of the printed resistor being in series with the diodes 194 and 196. The relative lengths L, $L_1$ and $L_2$ of the printed resistor 208 determine the effective threshold voltage of the zener diodes 192, 194 and 196, or the voltages of the battery 24 at which each diode will "turn on." The voltage from the battery 24 is impressed across zener diode 192 alone, zener diode 194 in series with the portion of the printed resistor 208 having a length "$L-L_1$", and zener diode 196 in series with the portion of the printed resistor 208 having a length "$L-L_2$". As a result, a larger voltage is necessary to cause breakdown in zener diodes 194 and 196 than is necessary to cause breakdown in zener diode 192 since there is a voltage drop across the resistors in series with zener diodes 194 and 196.

Each zener diode 192, 194 and 196 is preferably mounted to a surface of a substrate 210, such as a polyester film, opposite the surface upon which the corresponding temperature responsive display 198, 200 and 202 is disposed. The resistor 204 is preferably printed on the substrate opposite the temperature responsive display 206. The resistor 208 is positioned on the substrate so as not to interfere with the temperature responsive displays 198, 200, 202 and 206. The diodes 192, 194 and 196 and resistors 204 and 208 are preferably interconnected and connected to a supply of power through conductive paths 212 printed on the substrate 210.

As an example, consider a battery tester which is desired to provide a bar graph output with a visual change in a first bar occurring for a battery voltage greater than 12 volts, a visual change in a second bar occurring at 12.25 volts or higher and a visual change in the third bar occurring at 12.5 volts or higher. The first, second and third bars of the bar graph are represented by the temperature responsive displays 198, 200 and 202, respectively, which as noted above, are operated by the respective zener diodes, 192, 194 and 196. In this embodiment, each of the zener diodes 192, 194 and 196 would have a threshold conducting voltage of 12 volts. Since the full length "L" of the resistor 208 is electrically connected in parallel with the zener diode 192, the zener diode 192 will be presented with the full voltage load of the battery 24, and thus will begin conducting current and heating the temperature responsive display 198 at a 12 volt battery voltage. Since the zener diode 194 is in parallel with a shorter length $L_1$ of the resistor 208 and thus in series with a portion of the resistor 208, a voltage from the battery 24 higher than the 12 volts required to cause the zener diode 192 to conduct current will be required for the zener diode 194 also to begin conducting current and heating the corresponding temperature responsive display 200. The difference in the lengths $L_1$ and L required for the zener diode to have an effective 12.25 volt threshold voltage with L being two inches long is:

$$L - L_1 = \Delta L = \frac{12.25 \text{ volts} - 12 \text{ volts}}{12 \text{ volts}} = .0208(L = 2 \text{ inches}) = .042 \text{ inches}$$

Similarly, the zener diode 196 is connected in parallel with a length $L_2$ of resistor 208 which is computed in the same manner to yield a difference between L and $L_2$ of 0.84 inches, thus causing the zener diode 196 to have an effective threshold voltage in the circuit of 12.5 volts.

One advantage of the battery tester 190 is that the accuracy of the device is dependant primarily on the ratios of the distances L, $L_1$ and $L_2$ and that the overall resistor 208 can thus be made with wide tolerances while maintaining the ratios. The resistor 208 and the conductive paths connecting the resistor 208 to the diodes 192, 194 and 196 can be accurately placed using photographic replication or silk screening techniques thereby resulting in accurate ratios between the lengths L, $L_1$ and $L_2$ and accurate functioning of the battery tester 190. Further, often the battery tester 190 can be made with diodes from the same manufacturing batches increasing the accuracy of the device since diodes from the same manufacturing batch tend to have very similar threshold voltages.

The temperature responsive displays 198, 200, 202 and 206 are preferably thermochromic devices, having an opaque, for example, black, thermochromic material deposited overtop a colored area of the substrate. For example the temperature responsive displays 198, 200 and 202 may include yellow, orange and green backgrounds, respectively, each covered with a black thermochromic material that changes from opaque to transparent to reveal the colored backgrounds below at a transition temperature within the range of temperatures, for example about 45 or 47 degrees Celsius, to which the material will be heated by the corresponding diode when it is in a current conducting state. As a typical surface mount zener diode, such as those manufactured by Motorola, is approximately 0.125 inches long and can heat an area of approximately 0.2 inches in length, each temperature responsive display can be approximately 0.2 inches wide.

The resistor 204 preferably has a resistance value sufficient to heat the temperature responsive display 206 at approximately 8 volts or greater to indicate that the battery tester 190 is in electrical contact with the terminals of the battery 24 being tested. The temperature responsive display 206 may be somewhat larger than the temperature responsive displays 198, 200 and 202, for example, approximately one-half inch in length due to the nature of the resistor 204, with the resistor 204 large enough to heat substantially the whole area of the temperature responsive display 206. The temperature responsive display 206 is preferably formed of a black thermochromic material covering an area of a color different from that of the other temperature responsive displays 198, 200 and 202, for example, red.

The temperature responsive displays 206, 198, 200 and 202 thus together form a bar or band graph. If the battery tester 190, constructed as discussed in the example above, is connected to a partially discharged battery having a voltage greater than 12 volts but less than 12.25 volts, the resistor 204 will heat the temperature responsive display 206 and the zener diode 192 will heat display 198, thus changing the display bars to their red and yellow states, respectively. The temperature responsive displays 200 and 202 will however remain black, thus forming a partially colored bar graph. If the exemplary battery tester 190 is connected to a somewhat less partially discharged, but not fully charged battery having a voltage of at least 12.25 volts but less than 12.5 volts, the temperature responsive display bars 206, 198 and 200 will change to their respective red, yellow and orange states. The temperature responsive display 202 will remain black. Finally, if the battery tester is connected to a fully charged battery 24 supplying greater than 12.5 volts, all of the temperature responsive displays 206, 198, 200 and 202 of the bar graph will change to their colored states, namely red, yellow, orange and green, to indicate that the battery is fully charged. If the charge of the battery 24 is depleted below 12 volts, the only temperature responsive display that would change states is the display 206 to indicate that the battery tester 190 is in contact with the terminals of the battery.

Figure 29:
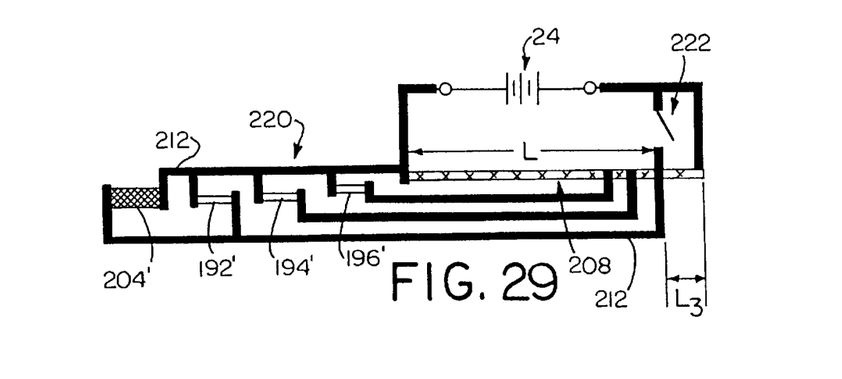
FIG. 29 is a view of a battery tester operative to test a battery under load conditions.
Figures 30, 31, 32:
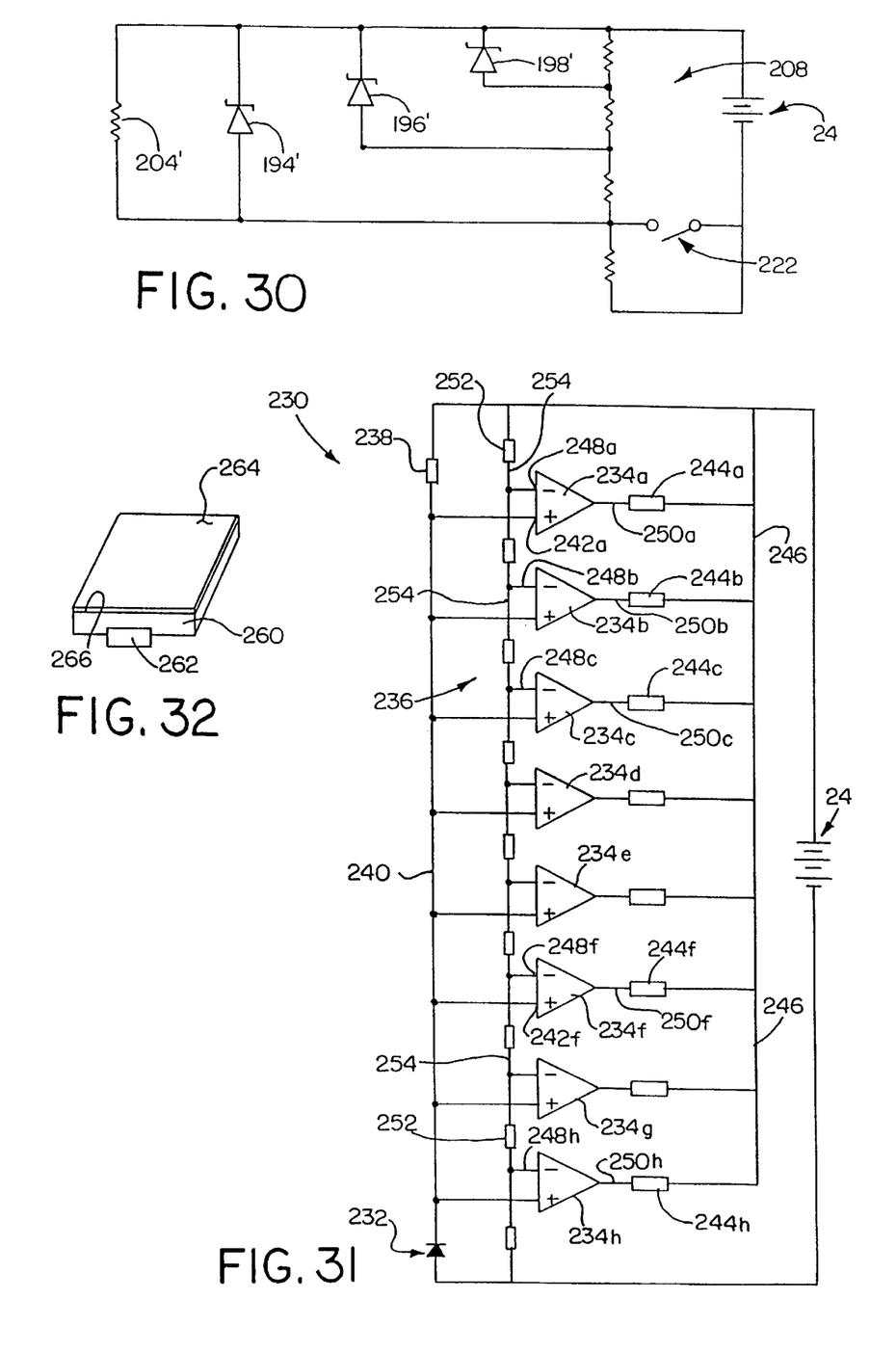
FIG. 30 is an electrical schematic diagram of the battery tester of FIG. 29.
FIG. 31 is an electrical schematic diagram of a battery tester employing a number of comparators.
FIG. 32 is a perspective view of a temperature responsive display in conjunction with an electrical package having current or voltage sensing capabilities.

FIGS. 29 and 30 illustrate an embodiment of a battery tester 220 having a discrete bar graph which can test the load voltage of the battery 24 as well as the open circuit voltage of the battery. The battery tester 220 is configured similar to the battery tester 190 discussed above relative to FIGS. 26 through 28, with the exception that the battery 24 is alternatively electrically connected in parallel with different lengths of the printed resister 208 by virtue of a shunt switch 222. When the shunt switch 22 is closed, the battery is connected in parallel with the length L of the printed resister 208. If, however, the switch 222 is open, then the battery 24 is then connected in parallel with the length L+$L_3$. The additional length of resistance $L_3$ reduces the voltage impressed across the zener diodes 192, 194, and 196 by an amount equal to the voltage drop across such length of resistance. Accordingly, the battery 24 can now be tested as if a load were present.

For example, it has been found that with the headlights on, there is a 1 volt drop across the battery of an automobile. A battery tester 220 configured to test a car battery under such a load would thus employ zener diodes 192', 194' and 196' with an 11 volt threshold conducting or breakdown voltage. Therefore, with the proper calculation of the length $L_3$, a 1 volt drop across the additional length $L_3$ of resistor 208 with the shunt switch 222 open can be achieved thus effectively simulating the battery 24 under load condition. If L is equal to 2 inches, $L_3$ will be 0.167 inches in order to obtain the 1 volt drop across $L_3$ necessary to simulate the load condition. The length of $L_3$ is obtained from the equation below:

$$\frac{12 \text{ volts} - 11 \text{ volts} = 1 \text{ volt}}{12 \text{ volts}} (L = 2 \text{ inches}) = .167 \text{ inches}$$

Thus, if the battery 24 is at a voltage which is between 12 and 12.25 volts, for example, the zener diodes 192', 194', and 196' will have between 11 and 11.25 volts impressed across them due to the voltage drop attributed to the resistance of the L3 length of the printed resister 208. Hence, only zener diode 192' will conduct current and heat its corresponding temperature responsive display 198, thus changing the display 198 to its colored state. If the battery 24 is at a voltage between 12.25 and 12.5 volts, the zener diodes 192', 194', and 196' will have between 11.25 and 11.5 volts impressed across them. Accordingly, zener diodes 192' and 194' will conduct current and will change their corresponding temperature responsive displays 198 and 200 to their colored states. Finally, if the battery 24 is at a voltage greater than 12.5 volts, the zener diodes 192', 194', and 196' will have 11.5 volts or greater impressed across them. As a result, each of the temperature responsive displays 198, 200, and 202 will change to their colored states. For each of the instances above the resistor 204' will also heat its corresponding display 206 to indicate that the battery tester 220 in contact with the battery 24.

If the shunt switch 222 is closed, the battery 24 will be electrically in parallel with length L of the printed resistor 208, as opposed to being in parallel with length L+$L_3$. In such an instance, the battery tester 220 will function essentially as described above for the battery tester 190 but over a different range of voltage levels. The shunt switch 222 can also be used to effectively change the testing range of the battery tester by changing the voltage available to the zener diodes.

A further embodiment of a voltage tester 230 employing a zener diode 232 in combination with a series of comparators 234a–h in a voltage divider network 236 to produce a bar graph display is illustrated in the circuit diagram of FIG. 31. (Herein multiple like components, e.g., comparators 234a–h, will be referred to generally by a reference number alone, e.g., comparator 234, and only when it is necessary to distinguish between like items in the tester will the alphabetical character also be used, e.g., comparator 234a.)

When the voltage tester 230 is connected to the battery 24 to be tested, the battery is electrically connected across the zener diode 232 in series with a current limiting resistor 238. The zener diode 232 functions as a voltage regulator at breakdown essentially fixing the voltage over line 240 connecting the zener diode and the current limiting resistor 238 voltage when zener diode is in its breakdown state. Hence, the voltage applied to line 240 and to the noninverting terminal 242 of each comparator 234 is fixed at a selected voltage, say 5.5 volts, which serves as the reference voltage for the comparators.

In operation, the comparators 234 each act as a switch selectively allowing current from the battery 24 to be applied over line 246 across a resistor 244a–h corresponding to each comparator. Each resistor 244 is thermally coupled to a temperature responsive display (not shown) which changes states, such as from black to a certain color, when a current is applied across the corresponding resistor 244. The temperature responsive displays may be any of a variety of shapes arranged in a variety of ways to provide a discernible output, for example, a bar graph.

When the voltage at the noninverting terminal 242 of a comparator 234 exceeds the reference voltage at the inverting terminal 248, current is not permitted to flow through the resistor 244 and the corresponding display will not change states, i.e., will remain black. If the reverse is true, i.e., the voltage at the inverting terminal 242 of a comparator 234 exceeds the reference voltage at the noninverting terminal 248, then the comparator output 250 is coupled to ground allowing current to flow from the battery 24 over line 246 and through the corresponding resistor 244 to ground. The resistor 244 will thus heat causing the temperature responsive display coupled to that resistor to change states, for example, from black to red. Since the reference voltage provided to the noninverting input 248 is a function of the breakdown or threshold conducting voltage of the zener diode 232, the testing range of the battery tester 230 may be shifted by selecting a zener diode with a different breakdown voltage.

The voltage applied to the inverting terminal 248 of the individual comparators 234 is determined by the voltage divider network 236 connected in parallel with the battery 24. The voltage divider network 236 includes a number of voltage dividing resistors 252 connected in series with one another, with each of the lines 254 connecting the individual resistors 252 being connected to the inverting terminal 242 of one of the comparators 234. As a result each comparator 234 will "see" a different voltage at its inverting terminal 248 which is a function of the number of voltage dividing resistors 252, and thus the total resistance, between the connection of the inverting terminal 248 to the line 254 and the battery 24. For example, the voltage applied to the inverting terminal 248a of comparator 234a will be greater than the voltage applied to the inverting terminal 248b of comparator 234b, which will be greater than the voltage applied to the inverting terminal 248c of comparator 234c, and so on.

Therefore, with the proper values of the resistors 252 in the voltage divider network 236, during operation comparator 234a will have its output 250a connected to ground when the battery 24 has a voltage equal to or greater than a voltage which is at the bottom of the testing range, and comparator 234h will have its output 250h connected to ground only when the battery 24 has a voltage at the top of the testing range. Intermediate comparators 234b–g will have their respective outputs 250b–g connected to ground at incremental voltages along the voltage testing range. The voltage tester 230 is thus able to provide a visual indication of battery voltage at a number of voltage levels.

As an example, consider a voltage tester 230 having a testing range of 12.3 volts to 13.0 volts and a bar graph display including eight visual bands indicating battery voltages evenly divided between 12.3 volts and 13.0 volts. Over the expected range of battery voltages the zener diode 232 would act to provide a reference voltage of 5.5 volts to the noninverting inputs 242a–h of the comparators 234a–h. The voltage dividing resistors 252 of the voltage divider network 236 would have resistance values chosen so that when the voltage source 24 delivers 13.0 volts, the voltage at the inverting input 248h of comparator 234h would be 5.5 volts and the voltage at each of the inverting inputs 248a–g would be greater than 5.5 volts; when the voltage source 24 delivers a voltage of 12.9 volts, the voltage at the inverting input 248h would be less than 5.5 volts while the voltage at the inverting input 248g would be 5.5 volts and the voltages at the inverting inputs 248a–f would be greater than 5.5 volts; and so on until for a voltage source 24 delivering only 12.3 volts, only the voltage at the inverting input 248a of comparator 234a is at 5.5 volts and the voltages at the inverting inputs 248b–h are less than 5.5 volts.

If such a voltage tester 230 is connected to a fully charged battery 24 delivering 13.0 volts, the voltages at all of the inverting inputs 248a–h will be at 5.5 volts or greater and all of the comparators 234a–h will essentially switch "on" to couple their respective outputs 250a–h to ground so that current flows from the battery through all the resistors 244a–h and causes each of the corresponding temperature responsive displays to change states from black to a discernible color. Conversely, if the battery 24 to which the tester 130 is connected is less than fully charged and delivers only 12.9 volts, only comparators 234a–g will switch "on" and only the temperature responsive displays corresponding to resistors 244a–h will change states, thus visually indicating a lower battery voltage. Further, if the battery 24 is more fully discharged so that it delivers only 12.3 volts, only comparator 234a will switch "on" and only the temperature responsive display corresponding to resistor 244a will change states thus indicating a low battery voltage.

Preferably the resistors 238, 244 and 252, and the lines 240, 254 and 246 are printed on a surface of a substrate with the zener diode 232 and comparators 234 being surface mount devices mounted to the appropriate passive elements on the surface of the substrate. The temperature responsive displays are disposed on the opposite surface of the substrate adjacent corresponding resistors 244, or, alternatively, between the resistors and the substrate. Since a number of the comparators 234 may be embodied into a single commercially available discrete device, such as the LM3914 chip manufactured by Motorola, Texas Instruments and National Semiconductor, for example, the number of discrete components and thus the overall cost of the tester can be reduced while improving the reliability and accuracy of the tester.

A further advantage of the voltage tester 230 is that its accuracy is dependent mainly upon the ratio of the various resistors 252 in the voltage divider network 236, as opposed to their actual values. The ratio of the resistors is governed by the graphic accuracy of the printing process, which is generally quite high. In addition, the accuracy of the tester 230 is improved due to the accuracy of the sequence of comparators 234. The comparators 234 may be embodied into commercially available devices which generally switch output states independent of the ambient temperature and are generally accurate to within 5 millivolts.

In some instances it may be possible to incorporate the thermochromic material onto the package containing the zener diode, such as is shown in FIG. 32. FIG. 32 is an illustration of a typical surface mount package 260 for a zener diode including contacts 262. The temperature responsive display 264 can be printed directly upon the top surface 266 of the package 260. The package 260 can then be incorporated into a suitably constructed battery tester similar to those described above. Alternatively, an electrical component such as the zener diode package 260 with a temperature responsive display 264 disposed thereon can be used in a variety of other means to provide current sensing or voltage sensing in any circuit, including those other than in battery testers.

What is claimed is:

1. A device for measuring the voltage of a voltage source comprising a plurality of temperature responsive displays and a circuit including plural heating circuits, each heating circuit for heating one of said plurality of temperature responsive displays when a threshold voltage of the heating circuit is exceeded, and a printed resistor, each heating circuit being connected to a length of said printed resistor such that the voltage of the voltage source at which each heating circuit heats a temperature responsive display is a function of the ratio of the lengths of said printed resistor to which said heating circuits are connected.

2. The device of claim 1, wherein each heating circuit includes a diode.

3. The device of claim 2, wherein said diode is a zener diode.

4. The device of claim 1, wherein said zener diodes in said plural heating circuits have the same threshold conducting voltage.

5. The device of claim 3, wherein said temperature responsive displays include a thermochromic material.

6. The device of claim 1, wherein the voltage source is connected across said printed resistor in parallel.

7. The device of claim 1, wherein at least one of said plural heating circuits is connected to a length of said printed resistor in series and to a different length of said printed resistor in parallel.

8. The device of claim 6, including a shunt switch for selectively determining the length of said printed resistor to which the voltage source is connected.

9. A device for measuring the voltage of a voltage source comprising a plurality of temperature responsive displays and a circuit including plural heating circuits, each heating circuit for heating one of said plurality of temperature responsive displays when a threshold voltage of the heating circuit is exceeded, and at least one printed resistor, each heating circuit being connected to a printed resistor such that the voltage of the voltage source at which each heating circuit heats a temperature responsive display is a function of the ratio of the resistances of said printed resistors to which said heating circuits are connected.

* * * * *